US008988076B2

(12) United States Patent
Mandal et al.

(10) Patent No.: US 8,988,076 B2
(45) Date of Patent: Mar. 24, 2015

(54) INTEGRATED NMR TRANSCEIVER ARRAY

(75) Inventors: Soumyajit Mandal, Cambridge, MA (US); Yi-Qiao Song, Newton Center, MA (US)

(73) Assignee: Schlumberger Technology Corporation, Sugar Land, TX (US)

(*) Notice: Subject to any disclaimer, the term of this patent is extended or adjusted under 35 U.S.C. 154(b) by 551 days.

(21) Appl. No.: 13/330,880

(22) Filed: Dec. 20, 2011

(65) Prior Publication Data

US 2013/0154635 A1   Jun. 20, 2013

(51) Int. Cl.
*G01V 3/00* (2006.01)
*G01R 33/36* (2006.01)
*G01V 3/32* (2006.01)

(52) U.S. Cl.
CPC ........ *G01R 33/3621* (2013.01); *G01R 33/3678* (2013.01); *G01V 3/32* (2013.01)
USPC .......................................... 324/322; 324/318

(58) Field of Classification Search
USPC ......................................... 324/322, 318, 314
See application file for complete search history.

(56) References Cited

U.S. PATENT DOCUMENTS

| 7,372,272 | B2 * | 5/2008  | Habara et al.    | 324/318 |
| 8,324,900 | B2 * | 12/2012 | Helvoort et al.  | 324/322 |
| 8,643,368 | B2 * | 2/2014  | Sun et al.       | 324/318 |

OTHER PUBLICATIONS

Sun et al. CMOS RF Biosensor Utilizing Nuclear Magnetic Resonance; IEEE Journal of Solid-State Circuits, 44:5 (2009) 1629-1643.
Hassibi et al. A spectral-scanning nuclear magnetic resonance imagining (MRI) transceiver. IEEE Journal of Solid-State Circuits, 44:6 (2009) 1805-1813.
Anders et al. A single chip array of NMR receivers. Journal of Magnetic Resonance, 201(2) (2009) 239-249.

* cited by examiner

*Primary Examiner* — Louis Arana

(57) ABSTRACT

The present disclosure relates to an integrated nuclear magnetic resonance (NMR) transceiver array, the array including a plurality of integrated NMR transceiver circuits disposed on a single chip. At least one of the plurality of integrated NMR transceiver circuits includes a transmitter that receives and outputs a radio frequency (RF) pulse train and a receiver that receives an NMR signal.

16 Claims, 4 Drawing Sheets

INTEGRATED NMR TRANSCEIVER ARRAY

TECHNICAL FIELD

This invention relates to nuclear magnetic resonance (NMR), and, more particularly, to circuits for NMR.

BACKGROUND

NMR spectroscopy and imaging are important for many fields, e.g., physics, chemistry, materials sciences, biology and medicine. For example, NMR has been used extensively to understand subsurface rock formation, oil reservoirs and water aquifers. Well-logging NMR has also been applied to the characterization of near surface water aquifers that are typically within 500 feet of the surface with the application in water reservoir characterization increasing rapidly.

In petroleum exploration, the use of a well-logging NMR device has been used to perform NMR measurement and logging for many years. There are also known relationships between NMR measurements and the petrophysical properties of the rock formations. The electronics used in both laboratory NMR and those used for other industrial applications, such as well-logging, are bulky and may be inconvenient to use for many applications that require mobility. They may also be costly which limits their broader applications.

SUMMARY

In one aspect, embodiments disclosed herein relate to an integrated nuclear magnetic NMR transceiver array. The array includes a plurality of integrated NMR transceiver circuits disposed on a single chip. At least one of integrated NMR transceiver circuits includes a transmitter that receives and outputs a radio frequency (RF) pulse train and a receiver that receives an NMR signal.

In another aspect, embodiments disclosed herein relate to a method for using an integrated NMR transceiver array. The method includes receiving a RF frequency reference clock input, a RF pulse train, an enable power amplifier (PA) during transmit phase input, an enable low-noise preamplifier (LNA) during receive phase input, a select local oscillator (LO) phase input, and a receiver shut down signal input at one of the plurality of NMR transceiver circuits for use in a transmitter and a receiver of the NMR transceiver array. The method also includes driving an off-chip coil using the transmitter with the RF pulse train, and receiving an NMR signal using the off-chip coil at the receiver. Further, the method includes processing the received NMR signal at the receiver using the enable PA during transmit phase input, the enable LNA during receive phase input, the select LO phase input, and the receiver shut down signal and outputting an amplified and filtered received NMR signal from the receiver.

In yet another aspect, embodiments disclosed herein relate to a NMR tool that is to be disposed downhole within a wellbore and integrated on a single printed circuit board. The NMR tool printed circuit board includes a complementary metal-oxide-semiconductor (CMOS) chip that includes a transceiver array of at least one of a plurality of integrated NMR transceiver circuits, at least one switch-based duplexer, at least one digitally-tunable impedance matching network, an analog-to-digital converter (ADC), a field-programmable gate array (FPGA), and a crystal oscillator. The NMR transceiver circuit includes a transmitter that receives and outputs a RF pulse train. The transmitter includes a duty cycle controller for varying the output power level of the RF pulse train and a PA for driving a coil with the RF pulse train. The NMR transceiver also includes a receiver that receives an NMR signal and has a shut down function that allows a received receiver shut down signal to completely turn off the receiver. The receiver includes a LNA that differentially amplifies the received NMR signal by a first gain value, a VGA that further amplifies the received NMR by a second gain value, a pair of differential mixers. The pair of differential mixers are driven by LO signals, receives the amplified received NMR signal from the VGA and outputs a demodulated real in-phase (I) output and a quadrature (Q) output of the received NMR signal. The receiver also includes a phase switcher that selectively flips the polarity of the positive and negative LO signals that feed each differential mixer and a low pass filter (LPF) that receives the I output and the Q output from the pair of differential mixers, and filters then outputs the received NMR signal.

Other aspects and advantages of the invention will be apparent from the following description and the appended claims.

DETAILED DESCRIPTION

In embodiments of the invention, numerous specific details are set forth in order to provide a more thorough understanding of the invention. However, it will be apparent to one with ordinary skill in the art that the invention may be practiced without these specific details. In other instances, well-known features have not been described in detail to avoid obscuring the invention.

One or more embodiments of the present disclosure relate generally to an integrated nuclear magnetic resonance (NMR) transceiver circuit. In various illustrative embodiments, a plurality of integrated NMR transceiver circuits is disposed on a single chip. In this manner, illustrative embodiments of the present invention advantageously perform multiple NMR measurements simultaneously. The plurality of NMR transceiver circuits may be implemented in standard complementary metal-oxide semiconductor (CMOS) technology. Additionally, the NMR transceivers may be used in a tool disposed downhole within a wellbore. Details of various embodiments are discussed below.

Figure 1:
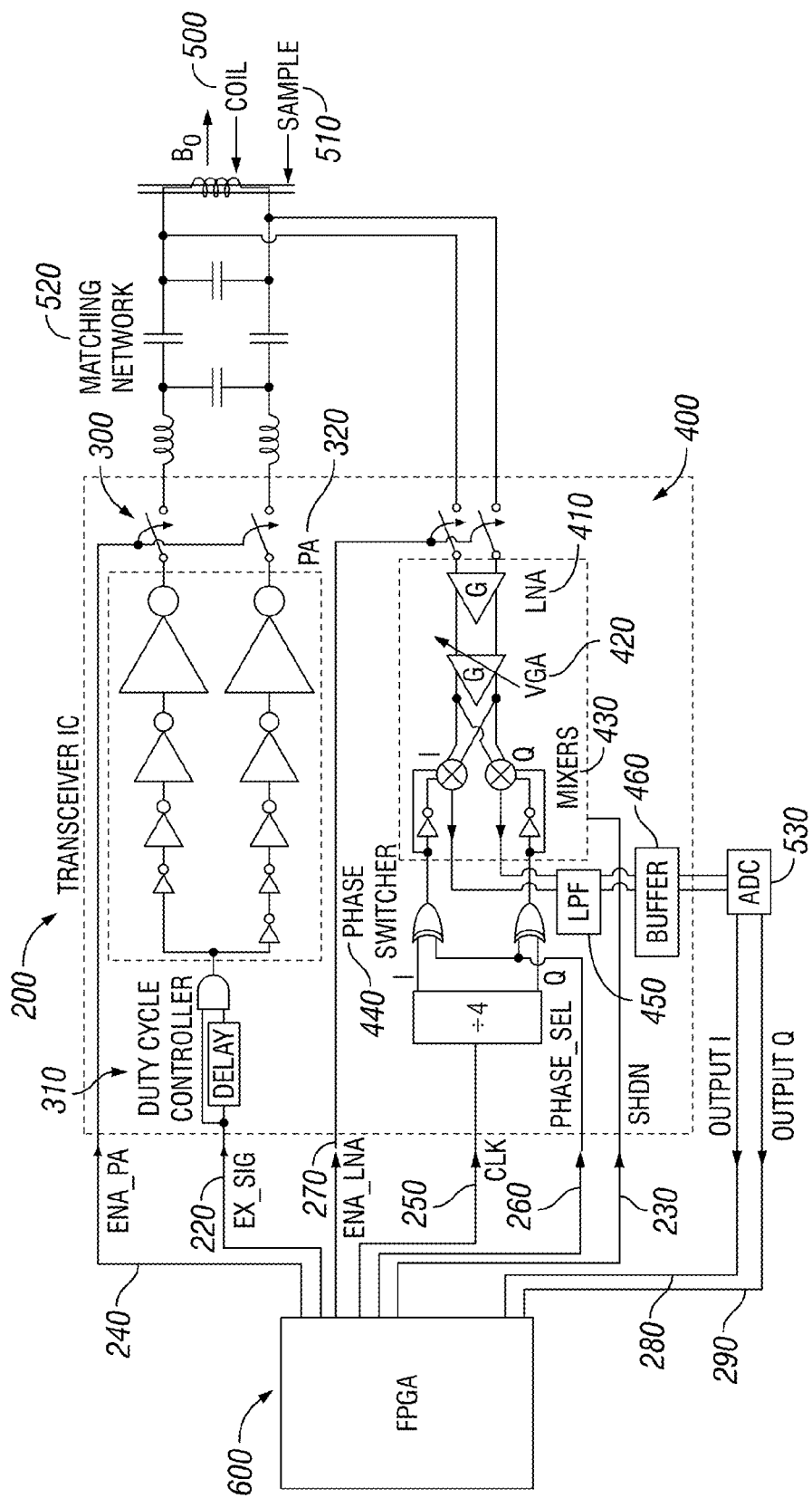
FIG. 1 is a block diagram of an integrated NMR transceiver circuit according to one or more embodiments of the present disclosure.

FIG. 1 is a block diagram of an integrated NMR transceiver circuit 200 according to one or more embodiments of the present disclosure. The NMR transceiver circuit 200 may contain an on-chip transmitter 300 and an on-chip receiver 400.

According to one or more embodiments of the present disclosure, the transmitter 300 receives a radio frequency (RF) pulse train signal 220 (EX_SIG) from an off-chip source 600. The transmitter also may receive an enable PA during transmit phase signal 240 (ENA_PA) from the off-chip source 600 that enables an on-chip power amplifier (PA) 320 during a transmit phase. The PA 320 may then output the RF pulse train signal 220 to an off-chip matching network 520 which is connected to an off-chip coil 500.

According to one or more embodiments of the present disclosure, the chip, on which a plurality of integrated NMR transceiver circuits are disposed, may provide low power levels to the off-chip coil 500. Therefore, according to one or more embodiments, the output RF pulse train signal 220 of the on-chip PA 320 is fed into an external power amplifier (not shown) before going to the off-chip coil 500. According to one or more embodiments of the present disclosure, the output RF pulse train signal 220 of the on-chip PA 320 is fed through an external duplexer (not shown) for use with the off-chip coil 500 when the off-chip coil 500 is a large external coil.

The receiver 400 may receive an RF frequency reference 250 (CLK) and a select local oscillator (LO) phase signal 260 (PHASE_SEL) from the off-chip source 600. In some embodiments, the RF frequency reference 250 is used as a form of a clock signal. The select LO phase signal 260 may be communicated to an on-chip phase switcher 440 for use. Further, the receiver 400 may receive an enable low-noise preamplifier (LNA) during receive phase signal 270 (ENA_LNA) from the off-chip source 600. When received, the enable LNA during receive phase signal 270 may enable an on-chip LNA 410 during a receive phase. The receiver 400 may also receive a receiver shut down signal 230. Additionally, in some embodiments, the receiver 400 receives an incoming NMR signal 510, labeled sample, from an off-chip coil 500. The receiver 400 may output both an in-phase NMR signal 280 and a quadrature NMR signal 290 as outputs to the off-chip source 600.

According to one or more embodiments of the present disclosure, the transmitter 300 contains an on-chip duty cycle controller 310 which initially receives the RF pulse train signal 220. The duty cycle controller 310 varies the output power level of the RF pulse train signal 220. In various embodiments, the transmitter 300 also contains the on-chip power amplifier (PA) 320 which receives the RF pulse train signal 220 from the duty cycle controller 310 after the output power has been varied by the duty cycle controller 310. The PA 320 drives an off-chip coil 500 by outputting the RF pulse train signal 220 to the coil 500, through the matching network 520, for transmission purposes. According to one or more embodiments of the present disclosure, the PA 320 may be a class-D switching power amplifier.

According to one or more embodiments of the disclosure, the receiver 400 uses a quadrature heterodyne architecture. Additionally, according to one or more embodiments of the present disclosure, the receiver 400 contains the on-chip low-noise preamplifier (LNA) 410 which receives an incoming reception signal from an off-chip coil 500. The incoming reception signal may be an NMR signal sample 510. The LNA 410 may then differentially amplify the received NMR signal 510 by a first gain value. The receiver 400 may also contain an on-chip variable-gain amplifier (VGA) 420. The VGA 420 receives the NMR signal 510 from the LNA 410. The VGA 420 further amplifies the received NMR signal 510 by a second gain value. In a specific embodiment, the receiver also contains a pair of on-chip differential mixers 430.

According to one or more embodiments of the present disclosure, the first gain value is large enough such that the overall noise figure of the receiver 400 is dominated by the first gain stage. According to one or more embodiments, a minimum first gain value is 20 dB. In addition, the gain may be small enough to ensure that the first stage may operate in its linear regime. According to one or more embodiments, a maximum first gain value is 60 dB. For example, according to one or more embodiments, the first gain value is 41 dB. According to one or more embodiment of the present disclosure, the second gain value may be between the values of −2 dB and 27 dB. A person of ordinary skill in the art will appreciate that the first gain value and the second gain value may be adjusted depending on the specific application and need of the NMR transceiver circuit 200.

According to one or more embodiments of the disclosure, the pair of differential mixers 430 is driven by a local oscillator signal which is selected by the select LO phase signal 260 received from the off-chip source 600. The output of the VGA 420 may be fed into the pair of differential mixers 430 which are driven by local oscillator (LO) signals in quadrature, i.e., with a relative phase shift of 90 degrees between them. The pair of differential mixers 430 may then demodulate the received NMR signal 510 into a real in-phase (I) output 280 and a quadrature (Q) output 290 which are sent to the off-chip source 600 through an analog-to-digital converter (ADC) 530. The LO signals frequency may be offset by a few kHz from the Larmor frequency. A person of ordinary skill in the art will appreciate that the frequency offset may eliminate the effects of DC offset and low-frequency 1/f or flicker noise that may be present within the amplifiers and mixers. According to one or more embodiments, a minimum value for the frequency offset may be 1 kHz and a maximum value may be around 100 kHz. As a result the demodulated I and Q outputs (280, 290) may not be centered about zero frequency (DC), but rather the LO signals frequency of a few kHz. This arrangement may improved the signal-to-noise ratio (SNR) of the output signals by reducing the effects of mixer offset voltages and low-frequency flicker noise.

According to one or more embodiments of the present disclosure, a noise factor (F) of a receiver 400 is defined as the ratio of input SNR to output SNR. Active circuits may add their own noise to the signal being processed, resulting in degradation of the SNR providing a non-zero value for F. The noise figure (NF) may be defined to be 10 log(F), where F is the noise factor. According to one or more embodiments, the noise figure of the receiver 400 is measured to be about 0.7 dB when the off-chip coil 500 has a certain quality factor. Specifically, the noise figure of the receiver 400 may depend on the quality factor of the coil 500. According to one or more embodiments, the noise figure decreases as the quality factor increases, as defined by, for example, the formula: $F=1+R_n/(R_s Q^2)$, where $R_n$ is the input-referred noise resistance of the receiver 400, $R_s$ is the equivalent series resistance of the coil 500, and Q is its quality factor. A possible value of $R_n$ for one or more embodiments of the chip 700 is 75Ω. Therefore, according to one or more embodiments, $R_s Q^2 \approx 430\Omega$ may provide a value of NF=0.7 dB, which is a reasonable $R_s$ value for off-chip coils at room temperature.

According to one or more embodiments, this performance is due to the use of low-noise circuit design techniques, and passive pre-amplification of the input signal 510 before being fed into the LNA 410. This process may reduce the effects of noise generated by the LNA 410 on the output SNR, thereby potentially decreasing the overall noise figure of the receiver 400.

According to one or more embodiments of the present disclosure, the receiver 400 also contains the on-chip phase switcher 440 which may implement phase alternation. Specifically, the phase switcher 440 may selectively flip the polarity of the positive and negative LO signals that feed into the pair of on-chip differential mixers 430. The phase switcher 440 may use the RF frequency reference 250 and the select local oscillator (LO) phase signal 260 when selectively flipping the polarity.

According to one or more embodiments, by implementing the phase switcher 440, the polarity of the differential mixer 430 outputs (280, 290) can be potentially reversed during the two halves of a phase-alternating pair (PAP) by changing the value of a single digital control signal. According to one or more embodiments of the present disclosure, the above function also is achieved in data acquisition software.

Additionally, according to one or more embodiments of the present disclosure, the receiver 400 contains an on-chip low pass filter (LPF) 450 that receives the I output 280 and the Q output 290 from the pair of differential mixers 430. The LPF 450 filters and outputs the I and Q outputs (280, 290) which a person of ordinary skill in the art will appreciate are, in combination, representative of the received NMR signal 510. When added to the output of each differential mixer 430, the passive LPF 450 may reduce the amount of broadband noise in the demodulated I and Q output signals (280, 290) generated by the transceiver circuit 200. In one or more embodiments, the LPF 450 may have a 3 dB cutoff frequency of approximately 2 MHz. According to one or more embodiments of the present disclosure, the cutoff frequency is at least as large as the LO offset frequency to ensure that the NMR signal is not attenuated by the LPF.

Figure 2:
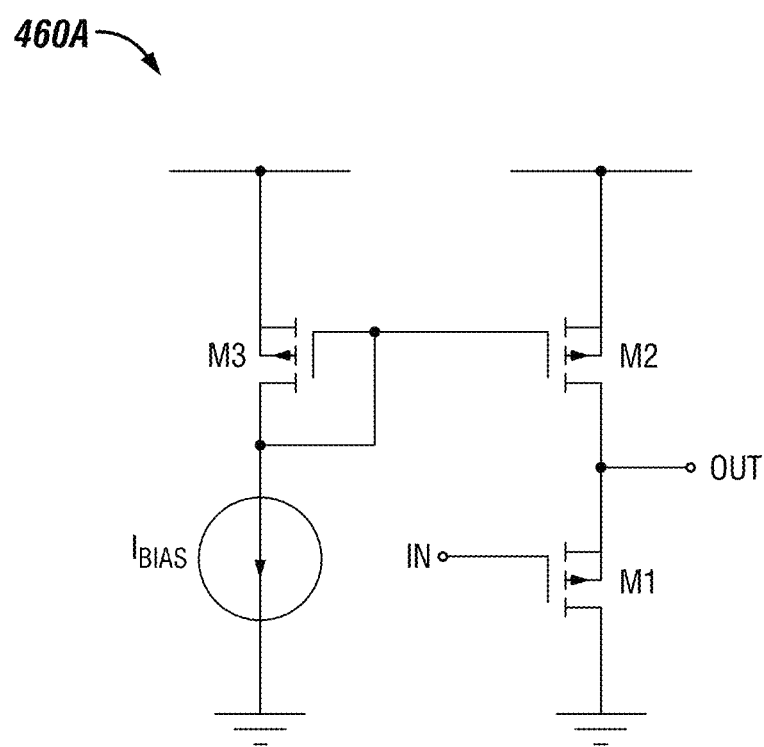
FIG. 2 is a circuit diagram of a single source follower buffer according to one or more embodiments of the present disclosure.

FIG. 2 shows a circuit diagram of a single-source follower buffer 460A. According to one or more embodiments of the present disclosure, as shown in FIG. 1, the receiver 400 also optionally contains an on-chip buffer 460 that receives the I output 280 and the Q output 290 from the LPF 450. Further, two of the buffer circuits 460A as shown in FIG. 2 may be used as the buffer 460 shown in FIG. 1 to buffer the I and Q output signals (280,290) from the LPF 450. The buffer 460 buffers and outputs both the I and Q outputs (280, 290), which together are the received NMR signal 510, off-chip to the off-chip source 600 through the ADC 530. According to one or more embodiments, the I and Q outputs (280, 290) of each differential mixer 430 are buffered using PMOS and NMOS source followers before being fed off-chip. Further, according to one or more embodiments of the disclosure, the PMOS source follower design shown in FIG. 2 may be used which has separated N-wells for the two transistors. This design may reduce the body effect and may increase signal gain by a factor of approximately 1.4 without affecting power consumption.

According to one or more embodiments of the present disclosure, the receiver 400 also contains a shut down function (not shown) which allows the received receiver shut down signal 230 (SHDN) to completely turn off the receiver 400. The shut down function allows the logic signal, also known as the received receiver shut down signal 230, to completely turn off the receiver 400 that is not being used, thus saving power. Specifically, according to one or more embodiments, the shut down signal 230 controls MOS switches that turn off the DC bias current of every block within the receiver 400.

According to one or more embodiments of the present disclosure, the off-chip coil 500 that transmits and receives may instead be a plurality of separate coils. Further, one or more of the separate coils can be one selected from a group consisting of a planar coil, a solenoidal coil, a honeycomb coil and a spiderweb coil. The off-chip coils may also be one of any other known type, shape and design. In some cases, off-chip coils may be useful because on-chip coils may have a low quality factor. Secondly, an on-chip coil may consume large amounts of chip area. Finally, an on-chip coil may constrain the design of the overall system because their location, type, shape and size are fixed.

According to one or more embodiments of the present disclosure the off-chip source 600 is an off-chip field-programmable gate array (FPGA). A person of ordinary skill in the art will appreciate that an FPGA is an integrated circuit designed to be configured by customers or designers after manufacturing (hence "field-programmable"). Static random-access memory (SRAM), Flash and electrically erasable programmable read-only memory (EEPROM) based FPGAs may be reprogrammed multiple times by the user. Fuse, Anti-fuse, and programmable read-only memory (PROM) based FPGAs may only be programmed once. FPGAs may contain programmable logic components called logic blocks, and a hierarchy of reconfigurable interconnects that allow the blocks to be logically wired together. Logic blocks may be configured to perform complex combinational functions. In most FPGAs, the logic blocks may also include memory elements, which may be simple flip-flops or more complete blocks of memory. Thus, FPGAs may be capable of implementing arbitrary combinational and sequential logic functions. FPGAs' configuration is specified using standard hardware description languages, such as Verilog and VHDL, or a circuit schematic. The latter is normally useful for small designs.

Therefore, according to one or more embodiments of the present disclosure, the FPGA 600 may be one selected from a group consisting of a SRAM, Flash, EEPROM, Fuse, Anti-fuse and PROM type FPGAs. A person of ordinary skill in the art will appreciate that the FPGA may also be another type as known in the art. A completely programmable FPGA may effectively replace the functionality of an on-chip pulse generator and may also be able to control the output power level by changing the duty cycle of the RF waveform. Specifically, a digital state machine that acted as the on-chip pulse generator may only generate the CPMG pulse sequence. In addition, pulse widths and echo spacings generated by the on-chip pulse generator may be constrained to a limited number of values, and phase alternation may not be available.

A person of ordinary skill in the art will appreciate that FPGA manufacturers may provide access to specialized software tools for design, simulation, and programming. Additionally, some FPGA manufacturers include Actel, Altera and Xilinx which may offer products that are designed to operate in the military and space temperature range of −55 deg C. to +125 degrees Celsius (C). Though more difficult to find, some commercial FPGAs may be rated at temperatures higher than +125 deg C., specifically, some parts are designed for automotive applications are specified to +150 deg C. A useful online resource for high-temperature FPGA-related issues is the NASA Office of Logic Design (OLD) website, located at http://klabs.org/richcontent/old_news/index.htm.

According to one or more embodiments of the present disclosure, each NMR transceiver circuit 200 utilizes six control signals (220-270) from the FPGA 600 in order to function, and may generate two output signals (280, 290), as shown in Table 1 below and FIG. 1. The outputs (280, 290) may be digitized and fed into the FPGA 600. Thus, the FPGA 600 may generate 60 output signals and process 20 inputs in the case where ten transceiver circuits 200 as placed on a single chip. According to one or more embodiments, the fastest signal is the RF frequency reference 250, which may be four times faster than the system frequency because an on-chip circuit may divide the clock signal down by a factor of 4 to generate the I and Q LO signals.

TABLE 1

Input and output signals for each NMR transceiver

| Name | Polarity | Description | Reference No. |
|---|---|---|---|
| CLK | Input | RF frequency reference | 250 |
| EX_SIG | Input | RF pulse train | 220 |
| ENA_PA | Input | Enable PA during transmit phase | 240 |
| ENA_LNA | Input | Enable LNA during receive phase | 270 |
| PHASE_SEL | Input | Select LO phase | 260 |
| SHDN | Input | Receiver shut down signal | 230 |
| OUTPUT_I | Output | In-phase NMR signal | 280 |
| OUTPUT_Q | Output | Quadrature NMR signal | 290 |

In one or more embodiments of the present disclosure, the FPGA 600 may be replaced by a microcontroller, a programmable logic device (PLD), or a computer-controlled data acquisition unit (DAQ).

Figure 3A:
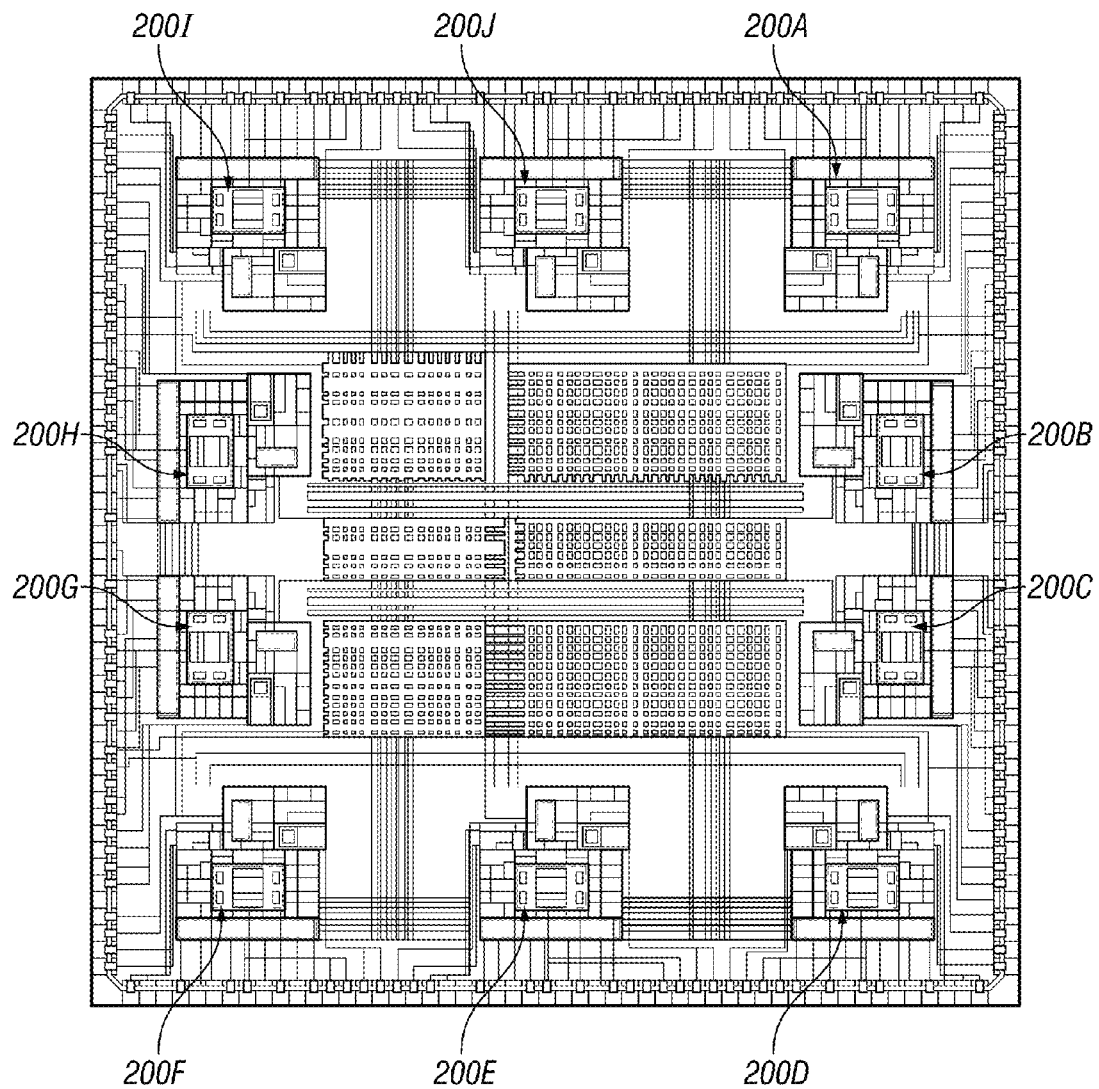
FIG. 3A is a layout of an NMR transceiver array chip according to one or more embodiments of the present disclosure.
Figure 3B:
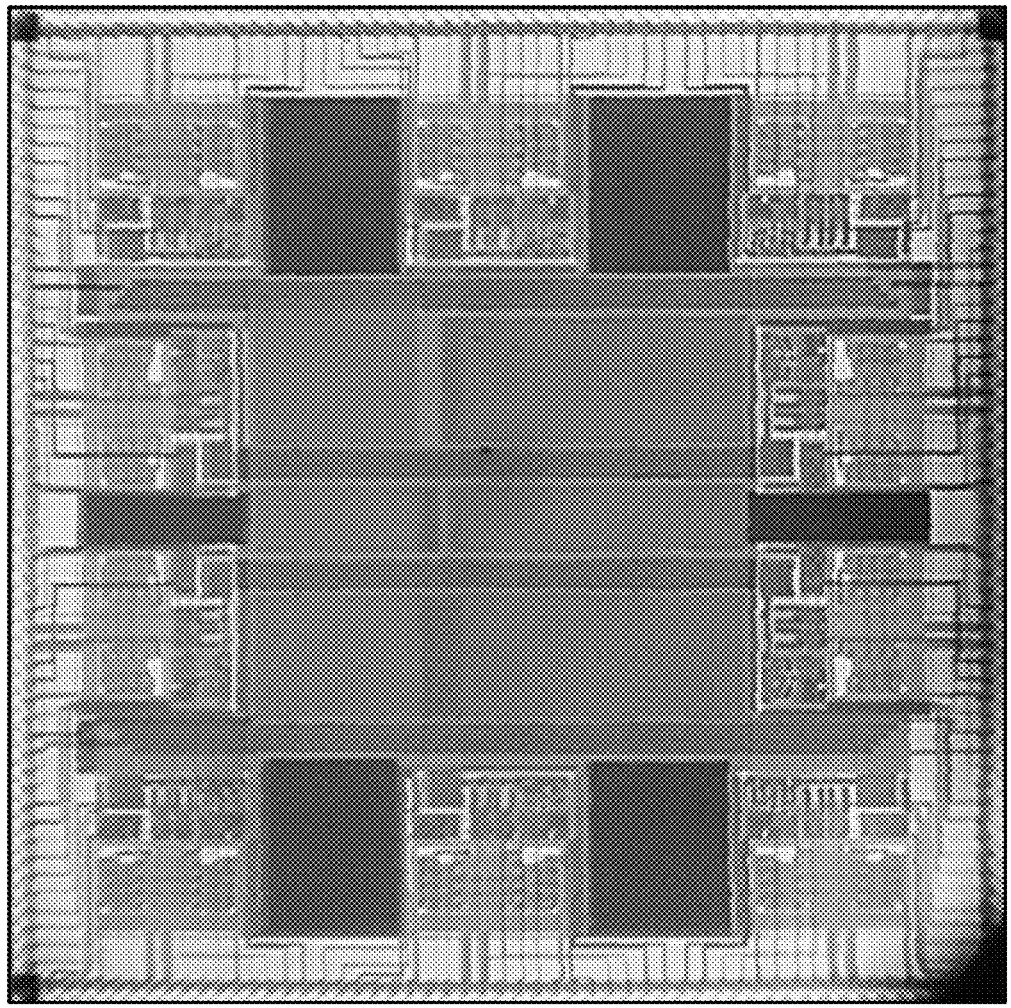
FIG. 3B is a die micro-photograph of the NMR transceiver array chip according to one or more embodiments of the present disclosure.

As shown in FIG. 3A and FIG. 3B and according to one or more embodiments of the present disclosure, a plurality of integrated NMR transceiver circuits 200A-200J may be disposed on a single chip 700 creating a highly-integrated array of NMR transceivers 200A-200J for NMR applications. In this manner, illustrative embodiments of the present invention advantageously perform multiple NMR measurements simultaneously. Specifically, according to one or more embodiments, the chip 700 may contain ten NMR transceiver circuits 200A-200J. Further, according to one or more embodiments, the chip 700 may be a complementary metal-oxide-semiconductor (CMOS) chip. A person of ordinary skill in the art will appreciate that other chip types may be used.

According to one or more embodiments of the present disclosure, the Larmor frequency of each transceiver circuit 200 ranges between 100 kHz and 50 MHz. The lower frequency limit is set by the RC time constant of the passive high-pass filters that isolate the different blocks within each receiver from each other. For example the passive high-pass filters may include the LNA 410, the VGA 420 and the differential mixers 430. The passive high-pass filters may isolate the DC bias points of the blocks. According to one or more embodiments, the high frequency limit may be set by parasitic capacitances at the output of the LNA 410 and VGA 420, which may limit their bandwidth. This adjustment may allow the circuit to be used in logging-while-drilling (LWD) NMR tool geometries (such as Schlumberger's proVISION™) with Larmor frequencies ranging between 200 kHz and 800 kHz.

According to one or more embodiments of the present disclosure, a person of ordinary skill in the art may use icfb v5.10.41, an industry-standard integrated circuit design software from Cadence Design Systems (http://www.cadence.com) for designing and laying out the chip 700. For example, a view of a layout according to one or more embodiments is shown in FIGS. 3A and 3B which show a layout 700 and a die micro-photograph 800, respectively. According to one or more embodiments, the layout design efficiently utilizes chip area while minimizing interference between the transceivers circuits 200A-200J. According to one or more embodiments, a chip 700 is fabricated by known methods in a process that may take between 8-12 weeks. Further, according to one or more embodiments, the chip 700 may occupy, for example, a die area of 5 mm×5 mm in the TSMC (Taiwan Semiconductor Manufacturing Company Ltd., http://www.tsmc.com) 0.18 micron CMOS process.

A person of ordinary skill in the art will appreciate that the chip design and manufacturing is not limited to the currently used process, and other processes might be beneficial to obtain higher temperature specifications. For example, according to one or more embodiments of the disclosure, silicon-on-insulator (SOI) processes may be used to reduce p-n junction leakage currents at high temperatures. Further, according to one or more embodiments, the number of transceivers 200A-200J is not limited by the surface area of the silicon die, but by the number of input/output pads that can be placed around its edges, for example, 208 input/output pads.

According to one or more embodiments of the present disclosure, the nominal power supply voltage of the chip 700 is 3.3 V. Further, according to one or more embodiments, the chip 700 may function on voltages as high as 5V. Further, larger power supply voltages may be used to increase the power delivered to each off-chip coil. Also, the NMR pulse sequences used by the chip 700 may be completely programmable by an off-chip source, for example, when they are generated by an external Field-Programmable Gate Array (FPGA) 600. According to one or more embodiments, the chip 700 and the transceiver array on the chip, which consists of a plurality of transceiver circuits 200, all use the same FPGA. In other embodiments, the chip 700 and the transceiver array on the chip use multiple FPGAs. In such embodiments, the same or different varieties of FPGAs are used.

According to one or more embodiments of the present disclosure, the signal-to-noise ratio (SNR) of the received NMR signal 510 is improved by connecting multiple transceivers 200A-200J to a single probe, and averaging their outputs. When the noise generated by each receiver is uncorrelated, it may be shown that the noise factor (F) of the multi-receiver system is given by $$F(N) \equiv \frac{SNR_{in}}{SNR_{out}}$$
$$= \frac{1}{N}[F(1) - 1] + 1,$$

where the noise factor of a single receiver is equal to F(1), and N receivers are being averaged. Thus, the noise figure (NF=10 log(F)) of the system may be reduced to a low level (close to the theoretical minimum of 0 dB) by increasing N. According to one or more embodiments of the present disclosure, the chip of transceivers 200A-200J may be used for spatial-resolution imaging by connecting the receivers to independent, spatially-separated probes. For example, azimuthal imaging may be performed in NMR well-logging tools that have cylindrically-symmetric geometries, such as Schlumberger's proVISION™.

According to one or more embodiments of the disclosure, the Larmor frequency of each transceiver 200A-200J on the chip 700 is set by the external FPGA 600, and may therefore be different for each transceiver 200A-200J. Further, according to one or more embodiments, the outputs of multiple transmitters are added together using an off-chip power combiner. As a result, the chip 700 of transceivers 200A-200J simultaneously excites spins at different Larmor frequencies, which may correspond to different depths of investigation in an inhomogeneous magnetic field. Such a strategy is known as spectral scanning, and is analogous to frequency-division multiplexing in communication systems. According to one or more embodiments, multiple depths may be investigated in parallel which may reduce scan time and/or improving SNR.

According to one or more embodiments of the present disclosure, the complete NMR system is integrated into a single printed circuit board. The front end may include a CMOS chip containing the transceiver array 700, switch-based duplexers and digitally-tunable impedance matching networks. The back end may include analog-to-digital converters (ADCs) to digitize the demodulated outputs from the CMOS chip, and an FPGA to generate clock and control signals. In addition, the printed circuit board may contain a crystal oscillator to serve as a frequency reference for the FPGA, voltage regulators, and other power management circuits.

Additionally, through integrated on-chip design, and by using standard silicon chip fabrication technology, a high level of integration may be obtained. This integration may reduce the number of electronic components required for NMR-based laboratory systems and the well-logging instruments. Further, the NMR transceiver array 700 may decrease the size, cost and power consumption of the tools, as well as increase the sensitivity and reliability. In particular, an integrated array of multiple NMR transceivers 700 may allow simultaneous measurement of multiple NMR sensors, for example, for different samples, at different locations, at different NMR frequencies, and/or at different orientations of the coils. In this manner, illustrative embodiments of the invention provide for parallel, high-throughput NMR analysis.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated nuclear magnetic resonance (NMR) transceiver array, the array comprising:
    a plurality of integrated NMR transceiver circuits disposed on a single chip, wherein the plurality of integrated NMR transceiver circuits is configured to receive a radio frequency (RF) pulse train from a programmable source that is external to the chip,
    wherein at least one of the plurality of integrated NMR transceiver circuits comprises
        a transmitter configured to receive and output the RF pulse train;
        a receiver that receives an NMR signal; and
        a duty cycle controller configured to control a duty cycle of the RF pulse train.

2. The integrated NMR transceiver array of claim 1, wherein the transmitter comprises a power amplifier (PA) for driving a coil with the RF pulse train.

3. The integrated NMR transceiver array of claim 1, wherein the receiver comprises;
    a low-noise preamplifier (LNA) that differentially amplifies the received NMR signal by a first gain value;
    a variable-gain amplifier (VGA) that further amplifies the received NMR by a second gain value;
    a pair of differential mixers that are driven by local oscillator (LO) signals, receives the amplified received NMR signal from the VGA, and outputs a demodulated real in-phase (I) output and a quadrature (Q) output of the received NMR signal;
    a phase switcher that selectively flips the polarity of the positive and negative LO signals that feed each differential mixer; and
    a low pass filter (LPF) that receives the I output and the Q output from the pair of differential mixers, and filters then outputs the received NMR signal.

4. The integrated NMR transceiver array of claim 3, wherein the receiver further comprises:
    a buffer that receives the I output and the Q output from the LPF and outputs the received NMR signal off-chip.

5. The integrated NMR transceiver array of claim 2, wherein the power amplifier is a differential class-D switching power amplifier.

6. The integrated NMR transceiver array of claim 2, wherein the coil is off-chip and is one selected from a group consisting of a planar coil, a solenoidal coil, honeycomb coil, and a spiderweb coil.

7. The integrated NMR transceiver array of claim 3, wherein the first gain value is 41 dB and the second gain value is between −2 dB and 27 dB.

8. The integrated NMR transceiver array of claim 3, wherein the receiver further comprises a shut down function that allows a received receiver shut down signal to completely turn off the receiver.

9. The integrated NMR transceiver array of claim 1,
    wherein the programmable off-chip source is comprised of an off-chip field-programmable gate array (FPGA), and
    wherein the transceiver array receives a RF frequency reference clock input, the RF pulse train, an enable PA during transmit phase input, an enable LNA during receive phase input, a select LO phase input, and a receiver shut down signal from the FPGA for at least one of the plurality of transceiver circuits.

10. The integrated NMR transceiver array of claim 9,
    wherein the FPGA is based on one selected from a group consisting of a Static random-access memory (SRAM), Flash, electrically erasable programmable read-only memory (EEPROM), Fuse, Antifuse, and programmable read-only memory (PROM).

11. The integrated NMR transceiver array of claim 2, wherein the transmitter outputs and drives the coil that is off-chip by first outputting and driving a matching network circuit that is disposed between the outputs of the transmitter and the inputs of the coil.

12. The integrated NMR transceiver array of claim 1,
    wherein, when the receiver outputs the received NMR signal off-chip, the NMR signal passes through an off-chip analogy to digital converter (ADC) and is then received at an off-chip field-programmable gate array (FPGA).

13. The integrated NMR transceiver array of claim 1,
    wherein the plurality of integrated NMR transceiver circuits are disposed on a single complementary metal-oxide-semiconductor (CMOS) chip.

14. A method for using an integrated nuclear magnetic resonance (NMR) transceiver array, the method comprising:
    receiving a radio frequency (RF) frequency reference clock input, a RF pulse train, an enable power amplifier (PA) during transmit phase input, an enable low-noise preamplifier (LNA) during receive phase input, a select local oscillator (LO) phase input, and a receiver shut down signal input at one of the plurality of NMR transceiver circuits for use in a transmitter and a receiver of the NMR transceiver array, wherein the RF pulse train is received from a programmable source that is external to the transceiver array;
    controlling a duty cycle of the RF pulse train with a duty cycle controller integrated with the NMR transceiver array on a single chip;
    driving an off-chip coil using the transmitter with the RF pulse train;
    receiving an NMR signal using the off-chip coil at the receiver;
    processing the received NMR signal at the receiver using the enable PA during transmit phase input, the enable LNA during receive phase input, the select LO phase input, and the receiver shut down signal; and outputting an amplified and filtered received NMR signal from the receiver.

15. The method of claim 14, wherein processing the received NMR signal further comprises:

differentially amplifying the received NMR signal by a first gain value using a LNA;

amplifying the received NMR by a second gain value using a variable-gain amplifier (VGA);

demodulating the received NMR into a real in-phase (I) output and a quadrature (Q) output of the received NMR signal using a pair of differential mixers;

selectively flipping the polarity of the positive and negative LO signals that feed the pair of differential mixers using a phase switcher;

filtering the received NMR signal I output and Q output through a low pass filter (LPF); and buffering the received NMR signal I output and Q output using a buffer.

16. A nuclear magnetic resonance (NMR) tool to be disposed downhole within a wellbore, the NMR tool printed circuit board comprising:

a complementary metal-oxide-semiconductor (CMOS) chip comprising a transceiver array of a plurality of integrated NMR transceiver circuits;

at least one switch-based duplexer;

at least one digitally-tunable impedance matching network;

an analog-to-digital converter (ADC);

a field-programmable gate array (FPGA) a radio frequency (RF) pulse train; and a crystal oscillator, wherein at least one of the NMR transceiver circuits comprises:

a transmitter that receives and outputs the RF pulse train, wherein the transmitter comprises a duty cycle controller configured to control a duty cycle of the RF pulse train, and a power amplifier (PA) configured to drive a coil with the RF pulse train; and a receiver configured to receive an NMR signal and has a shut down function that allows a received receiver shut down signal to completely turn off the receiver, wherein the receiver comprises a low-noise preamplifier (LNA) configured to differentially amplify the received NMR signal by a first gain value, a variable-gain amplifier (VGA) configured to further amplify the received NMR by a second gain value, a pair of differential mixers configured to (a) be driven by local oscillator (LO) signals, (b) receive the amplified received NMR signal from the VGA, and (c) output a demodulated real in-phase (I) output and a quadrature (Q) output of the received NMR signal, a phase switcher configured to selectively flip the polarity of the positive and negative LO signals that feed each differential mixer, and a low pass filter (LPF) configured to (a) receive the I output and the Q output from the pair of differential mixers, and (b) filter then output the received NMR signal.

* * * * *